(12) United States Patent
Lee et al.

(10) Patent No.: US 11,681,185 B2
(45) Date of Patent: Jun. 20, 2023

(54) DISPLAY DEVICE

(71) Applicant: Samsung Display Co., Ltd., Yongin-Si (KR)

(72) Inventors: Hyo-Chul Lee, Hwaseong-si (KR); In Soo Wang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 131 days.

(21) Appl. No.: 17/078,056

(22) Filed: Oct. 22, 2020

(65) Prior Publication Data

US 2021/0280570 A1   Sep. 9, 2021

(30) Foreign Application Priority Data

Mar. 9, 2020   (KR) .................. 10-2020-0029003

(51) Int. Cl.
| | | |
|---|---|---|
| *H01L 25/18* | (2023.01) | |
| *G02F 1/1362* | (2006.01) | |
| *G02F 1/1345* | (2006.01) | |
| *H10K 59/121* | (2023.01) | |

(52) U.S. Cl.
CPC .... *G02F 1/13452* (2013.01); *G02F 1/136286* (2013.01); *H01L 25/18* (2013.01); *G02F 1/1345* (2013.01); *H05K 2201/10136* (2013.01); *H10K 59/1213* (2023.02)

(58) Field of Classification Search
None
See application file for complete search history.

(56) References Cited

U.S. PATENT DOCUMENTS

| | | | | |
|---|---|---|---|---|
| 2011/0128485 | A1* | 6/2011 | Kim | .............. G02F 1/1345 |
| | | | | 349/122 |
| 2013/0050173 | A1 | 2/2013 | Koo | |
| 2015/0194444 | A1* | 7/2015 | Koo | .............. G09G 3/2092 |
| | | | | 257/43 |
| 2017/0309242 | A1* | 10/2017 | Kim | ............ G02F 1/136286 |
| 2017/0343868 | A1* | 11/2017 | Kim | .............. G02F 1/1339 |
| 2020/0035162 | A1* | 1/2020 | In | .............. G09G 3/3275 |

FOREIGN PATENT DOCUMENTS

| | | |
|---|---|---|
| KR | 10-2017-0038415 A | 4/2017 |
| KR | 10-2018-0003363 A | 1/2018 |
| KR | 10-2019-0079227 A | 7/2019 |
| KR | 10-2019-0080346 A | 7/2019 |
| KR | 10-2019-0090101 A | 8/2019 |

* cited by examiner

*Primary Examiner* — Shan Liu
(74) *Attorney, Agent, or Firm* — Innovation Counsel LLP

(57) ABSTRACT

A display device includes a display area including gate lines; a plurality of gate drivers disposed in a non-display area that is adjacent to the display area and connected to the gate lines; and a driving power transmitting line disposed in the non-display area and providing a driving power to the gate drivers. The driving power transmitting line includes a first driving power transmitting line and a second driving power transmitting line overlapping each other with an insulating layer disposed therebetween, the first driving power transmitting line and the second driving power transmitting line are connected with each other through a plurality of contact holes formed in the insulating layer, and the contact holes are disposed in a plurality of regions respectively overlapping the gate drivers in a direction parallel to an extending direction of the gate lines.

5 Claims, 11 Drawing Sheets

DISPLAY DEVICE

CROSS-REFERENCE TO RELATED APPLICATION

This application claims priority to and benefits of Korean Patent Application No. 10-2020-0029003, filed in the Korean Intellectual Property Office on Mar. 9, 2020, the entire contents of which are incorporated herein by reference.

BACKGROUND

(a) Field

The present disclosure relates to a display device, more particularly, a display device including a plurality of driving power transmitting lines.

(b) Description of the Related Art

The display device includes a liquid crystal display (LCD), a plasma display panel (PDP), an organic light emitting diode (OLED) device, an inorganic light emitting diode (LED) device, a quantum dot LED (QLED) device, a field effect display (FED), an electrophoretic display device, and the like.

Recently, a bezel size of a display device is reduced to increase an occupying ratio, also referred to as a screen-to-body ratio, of a display screen. The screen-to-body ratio reflects a technical specification of the display device, and it is also an important factor for a consumer's selection for a product.

As the bezel size of the display device is reduced, a non-display area around a display area is reduced, and accordingly, an area in which a signal transmitting line for transmitting a signal for driving a display device is positioned may also be reduced, thereby narrowing a width of the signal transmitting line. A narrowed signal transmitting line may delay transmitting of a carried signal.

The above information disclosed in this Background section is provided for enhancement of understanding of the background of the present disclosure, and therefore it may contain information that may not form a prior art that is already known to a person of ordinary skill in the art.

SUMMARY

Exemplary embodiments of the present disclosure provide a display device capable of preventing a signal delay of a driving power transmitting line and reducing a change in a driving voltage according to a position of a driver in a case where the display device has a narrow non-display area.

A display device according to an embodiment includes: a display area including a plurality of signal lines, the plurality of signal lines including a plurality of gate lines; a plurality of gate drivers disposed in a non-display area that is adjacent the display area and connected to the plurality of gate lines; and a driving power transmitting line disposed in the non-display area and providing a driving power to the plurality of gate drivers. The driving power transmitting line includes a first driving power transmitting line and a second driving power transmitting line overlapping each other with an insulating layer disposed therebetween. The first driving power transmitting line and the second driving power transmitting line are connected with each other through a plurality of contact holes formed in the insulating layer. The plurality of contact holes is disposed in a plurality of regions respectively overlapping the plurality of gate drivers in a direction parallel to an extending direction of the plurality of gate lines.

The first driving power transmitting line may be disposed adjacent to the plurality of gate drivers and connected to the plurality of gate drivers, and the second driving power transmitting line may be connected to the first driving power transmitting line through the plurality of contact holes.

The plurality of signal lines may further include a plurality of data lines. The first driving power transmitting line may be disposed on a same layer as the plurality of gate lines, and the second driving power transmitting line may be disposed on a same layer as the plurality of data lines.

A display device according to another embodiment includes: a display area including a plurality of signal lines, the plurality of signal lines including a plurality of gate lines; a plurality of gate drivers disposed in a non-display area that is adjacent to the display area and connected to the plurality of gate lines; and a driving power transmitting line disposed in the non-display area and providing a driving power to the plurality of gate drivers. The driving power transmitting line includes a first driving power transmitting line and a second driving power transmitting line overlapping each other with an insulating layer disposed therebetween. The first driving power transmitting line includes a first portion and a second portion that are separated from each other by a cutout. The first driving power transmitting line includes a pad portion that provides the driving power, and the first portion is connected to the pad portion.

A first length of the first portion may be shorter than a second length of the second portion.

The first portion of the first driving power transmitting line may be connected with the second driving power transmitting line through a first contact hole that is formed in the insulating layer. The first contact hole may be disposed adjacent to the pad portion in a direction that is parallel to an extending direction of the plurality of gate lines without overlapping the plurality of gate drivers.

The second portion of the first driving power transmitting line may be connected with the second driving power transmitting line through a plurality of second contact holes formed in the insulating layer. The plurality of second contact holes may be disposed in the direction that is parallel to the extending direction of the plurality of gate lines and overlap one or more of the plurality of gate drivers.

A display device according to another embodiment includes: a display area including a plurality of signal lines, the plurality of signal lines including a plurality of gate lines; a plurality of gate drivers disposed in a non-display area that is adjacent to the display area and connected to the plurality of gate lines; and a driving power transmitting line disposed in the non-display area and providing a driving power to the plurality of gate drivers. The driving power transmitting line includes a first driving power transmitting line and a second driving power transmitting line overlapping each other with an insulating layer disposed therebetween. The first driving power transmitting line includes a first portion and a second portion that are connected with a high resistance portion. The first driving power transmitting line includes a pad portion that provides the driving power, and the first portion is connected to the pad portion.

A first width of the high resistance portion may be narrower than a second width of the first driving power transmitting line.

The first width of the high resistance portion may be about 1/10 of the second width of the first driving power transmitting line.

The gate drivers may be attached to a side surface of the display device.

According to the embodiments, a display device is capable of preventing a signal delay of a driving power transmitting line and reducing a change in a driving voltage according to a position of a driver in a case where the display device has a narrow non-display area.

DETAILED DESCRIPTION OF THE EMBODIMENTS

Figure 1:
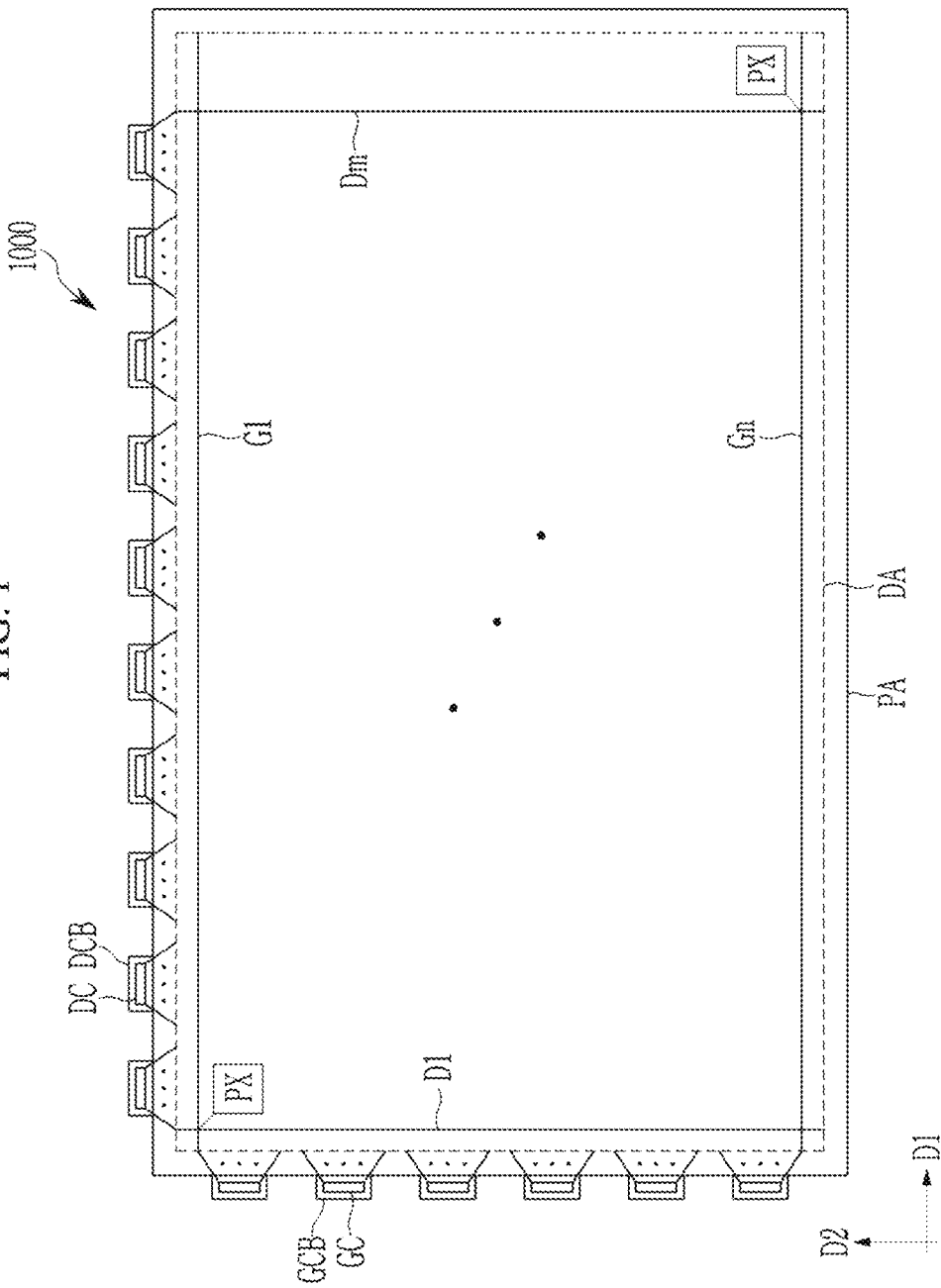
FIG. 1 illustrates a plan view of a display device according to an embodiment.

The exemplary embodiments will be described more fully hereinafter with reference to the accompanying drawings. As those skilled in the art would realize, the described embodiments may be modified in various ways, without departing from the spirit or scope of the present disclosure.

To clearly describe the present disclosure, elements or any portions thereof that are irrelevant to the description may be omitted, and like numerals refer to like or similar constituent elements throughout the specification.

Further, since sizes and thicknesses of constituent elements shown in the accompanying drawings are arbitrarily given for better understanding and ease of description, the present disclosure is not limited to the illustrated sizes and thicknesses. In the drawings, the sizes and/or thicknesses of some layers, films, panels, regions, etc., may be exaggerated for clarity, better understanding, or ease of description.

It will be understood that when an element such as a layer, film, region, or substrate is referred to as being "on" another element, it can be directly on the other element, or one or more intervening elements may be present. In contrast, when an element is referred to as being "directly on" another element, no intervening element may be present. Further, in the specification, the word "on" or "above" means positioned on or below an object, and does not necessarily mean positioned on an upper side of the object based on a gravitational direction.

In addition, unless explicitly described to the contrary, the word "comprise" and its variations such as "comprises" or "comprising" will be understood to imply an inclusion of stated elements but not an exclusion of any other elements.

Further, in the specification, the phrase "in a plan view" means when an object is viewed from above, and the phrase "in a cross-section" means when a cross-section taken by vertically cutting an object is viewed from the side.

In addition, in the specification, the word "connected" means that two or more components may not be necessarily directly connected, but they may be connected indirectly through another component, encompassing not only physically connected but also electrically connected, or it may have been referred to as different names depending on the location or function, but it may mean "integrally connected."

A display device according to an embodiment will be schematically described with reference to FIG. 1. FIG. 1 illustrates a plan view of a display device according to an embodiment.

A display device 1000 includes a plurality of signal lines including a plurality of gate lines G1, . . . , and Gn and a plurality of data lines D1, . . . , and Dm, a display area DA including a plurality of pixels PX connected to the signal lines, and a non-display area PA around the display area DA. The non-display area PA may have a relatively small area compared to the display area DA, and may be invisible.

The gate lines G1, . . . , and Gn may extend along a first direction D1, and may be connected to a plurality of gate drivers GC to receive a gate driving signal. The date lines D1, . . . , and Dm may extend along a second direction D2 perpendicular to the first direction D1, and may be connected to a plurality of date drivers DC to receive a data signal.

The gate drivers GC may be mounted on a plurality of gate driving circuit boards GCB, and the data drivers DC may be mounted on a plurality of data driving circuit boards DCB. Each of the gate drivers GC and the data drivers DC may be provided in various forms. For example, each of the gate drivers GC and the data drivers DC may be attached to a corresponding one of the gate driving circuit boards GCB and the data driving circuit boards DCB in a form of at least one integrated circuit (IC) chip, may be mounted on a flexible printed circuit film to attached to the non-display area PA in a form of a tape carrier package (TCP), or may be mounted on a separate printed circuit board (not illustrated). In another example, each of the gate drivers GC and the data drivers DC may be directly formed in the non-display area PA and connected to the gate lines G1, . . . , and Gn and the data lines D1, . . . , Dm.

In FIG. 1, the gate drivers GC and the data drivers DC are illustrated as being disposed at one side of the non-display area PA, but the present disclosure is not limited thereto. In some embodiments, the gate drivers GC may be disposed at opposite sides along the first direction D1 with the plurality of gate lines G1, . . . , and Gn disposed therebetween, and the data drivers DC may be disposed at opposite sides along the second direction D2 with the data lines D1, . . . , and Dm disposed therebetween.

Figure 2:
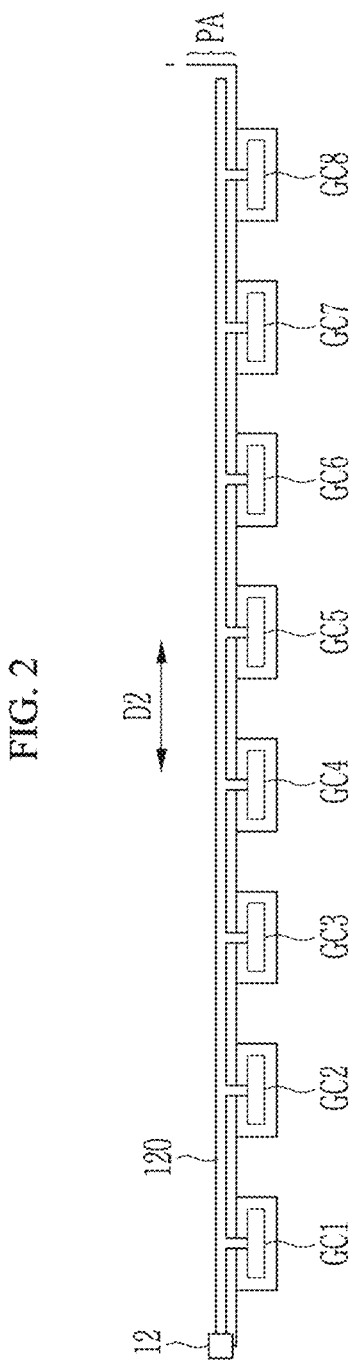
FIG. 2 illustrates an enlarged view showing a portion of a display device according to an embodiment.
Figure 3:
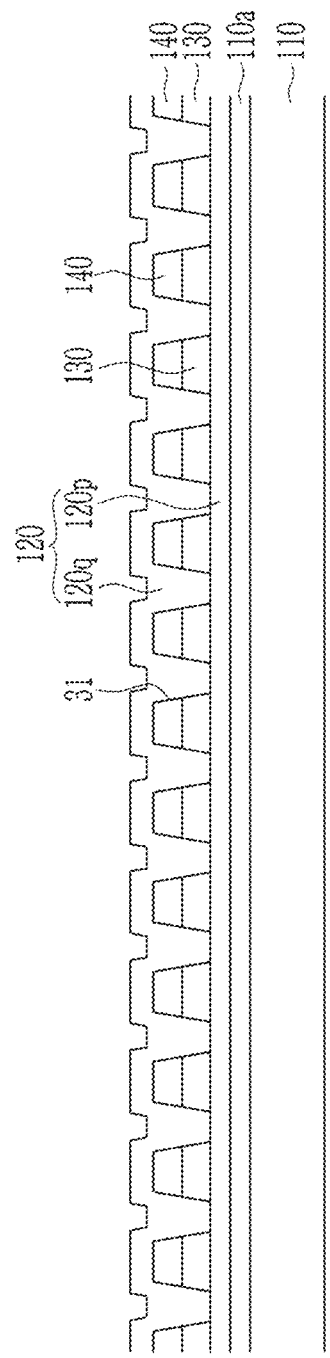
FIG. 3 illustrates a cross-sectional view of a portion of a non-display area of FIG. 2 taken along a direction that is parallel to a second direction.
Figure 4:
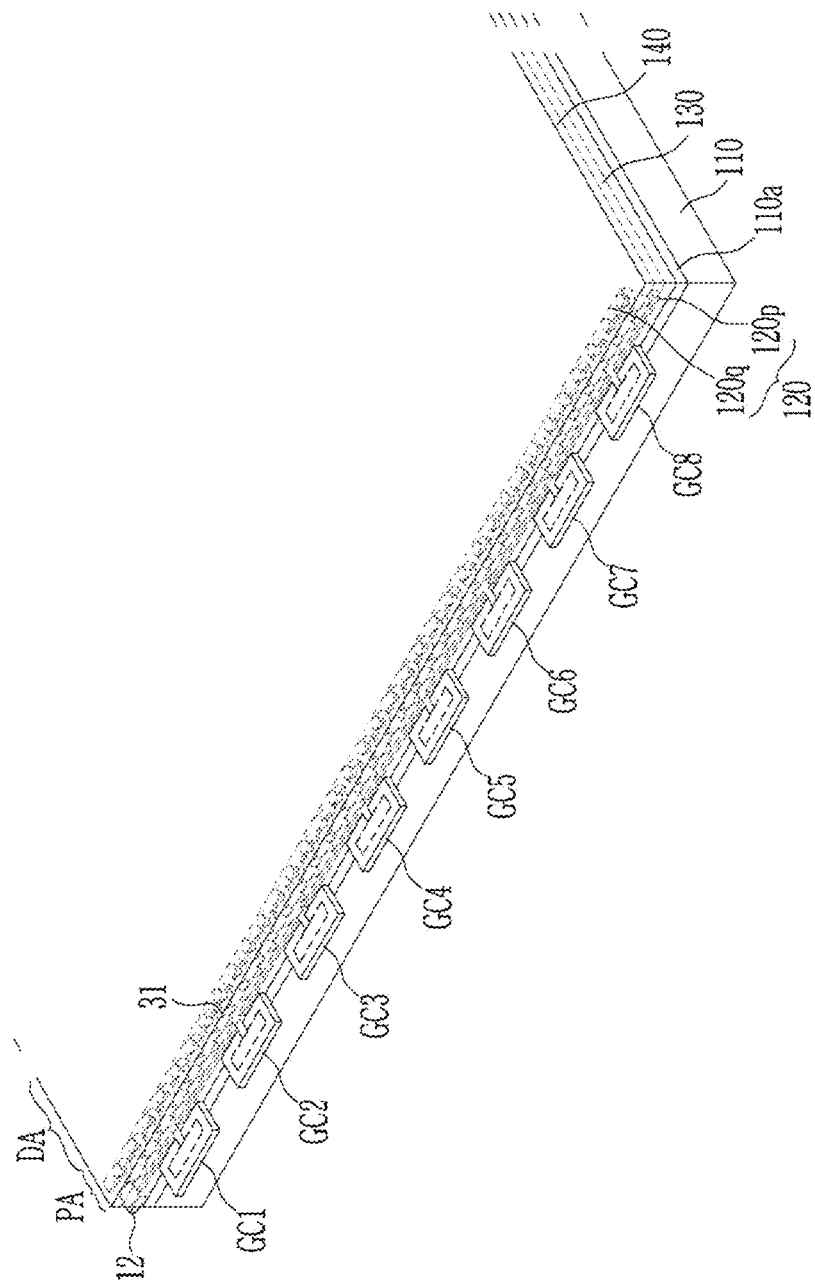
FIG. 4 illustrates a perspective view showing a portion of the display device illustrated in FIG. 2 and FIG. 3.

Although not illustrated in FIG. 1, the display device 1000 may further include a driving power transmitting line for transmitting a driving power to the gate drivers GC. This will be described in more detail with reference to FIG. 2 to FIG. 4. FIG. 2 illustrates an enlarged view showing a portion of a display device according to an embodiment, FIG. 3 illustrates a cross-sectional view of a portion of a non-display area of FIG. 2 taken along a direction that is parallel to a second direction, and FIG. 4 illustrates a perspective view showing a portion of the display device 1000 illustrated in FIG. 2 and FIG. 3.

In the following drawings, eight gate drivers GC are illustrated for convenience of description. However, the present disclosure is not limited thereto, and it is understood that the display device 1000 may include other number of gate drivers GC without deviating from the scope of the present disclosure.

Referring to FIG. 2, a part of the non-display area PA along the second direction D2 is illustrated. The gate drivers GC1, GC2, GC3, GC4, GC5, GC6, GC7, and GC8 are connected to a driving power transmitting line 120 to receive a driving power for driving gates of the gate drivers GC1 to GC8.

The driving power transmitting line 120 includes a pad portion 12 that is disposed at an end portion thereof, and may supply the driving power from the outside through the pad portion 12. The driving power may provide a gate-on signal and a gate-off signal to the gate driver GC1 to GC8.

Referring to FIG. 3 and FIG. 4, the display device 1000 includes an insulating substrate 110, a buffer layer 110a, insulating layers 130 and 140, and the driving power transmitting line 120. The driving power transmitting line 120 includes a first driving power transmitting line 120p disposed under the insulating layers 130 and 140 and a second driving power transmitting line 120q disposed on the insulating layers 130 and 140 with the insulating layers 130 and 140 interposed therebetween. The insulating layers 130 and 140 have a plurality of contact holes 31, and the first driving power transmitting line 120p and the second driving power transmitting line 120q are connected with each other through the contact holes 31. The first driving power transmitting line 120p of the driving power transmitting line 120 may be formed in the same layer as the gate lines G1, . . . , and Gn, and the second driving power transmitting line 120q of the driving power transmitting line 120 may be formed in the same layer as the data lines D1, . . . , and Dm. The insulating layers 130 and 140 may correspond to gate insulating layers, interlayer insulating layers, and the like. Although two insulating layers 130 and 140 are disposed between the first driving power transmitting line 120p and the second driving power transmitting line 120q in the present embodiment, the present disclosure is not limited thereto, and one, or more than two insulating layers may be disposed between the first driving power transmitting line 120p and the second driving power transmitting line 120q.

The interlayer structure of the insulating layers will be described in more detail. The buffer layer 110a is disposed on the insulating substrate 110, the first driving power transmitting line 120p of the driving power transmitting line 120 that is connected to the gate drivers GC1, GC2, GC3, GC4, GC5, GC6, GC7, and GC8 is disposed on the buffer layer 110a, and the insulating layers 130 and 140 having the contact holes 31 are disposed on the first driving power transmitting line 120p. The contact holes 31 of the insulating layers 130 and 140 overlap the first driving power transmitting line 120p. The second driving power transmitting line 120q is disposed on the insulating layers 130 and 140 and connected to the first driving power transmitting line 120p through the contact holes 31 of the insulating layers 130 and 140. The contact holes 31 may be disposed to correspond to each of the regions overlapping the gate drivers GC1, GC2, GC3, GC4, GC5, GC6, GC7, and GC8 along a direction that is parallel to a direction in which the gate lines G1, . . . , and Gn extend. FIG. 3 illustrates a step difference formed on an upper surface of the second driving power transmitting line 120q due to a step difference between the insulating layers 130 and 140; however, the present disclosure is not limited thereto, and the upper surface of the second driving power transmitting line 120q may be substantially flat without a step difference.

The driving power may be simultaneously applied to the gate drivers GC1, GC2, GC3, GC4, GC5, GC6, GC7, and GC8 via the driving power transmitting line 120 through the pad portion 12.

Since the driving power that is supplied through the pad portion 12 is transmitted to the gate drivers GC1, GC2, GC3, GC4, GC5, GC6, GC7, and GC8 through the driving power transmitting line 120, a voltage drop may occur in the applied driving power due to the resistance of the driving power transmitting line 120 and the resistance of the gate drivers GC1 to GC8.

In particular, as a width of the non-display area PA of the display device 1000 in which the driving power transmitting line 120 is disposed is narrowed, a width of the driving power transmitting line 120 is also narrowed, and accordingly, the resistance of the driving power transmitting line 120 may be increased. Accordingly, the voltage drop of the driving power transmitted to the gate drivers GC1 to GC8 may be increased. A voltage difference between adjacent gate drivers depending on the voltage drop of the driving power may be recognizable as a line (e.g., a dark line) that extends in a direction of the gate lines G1, . . . , and Gn along a space between the gate drivers GC1 to GC8.

In accordance with the display device 1000 according to the embodiment, the driving power transmitting line 120 may include the first driving power transmitting line 120p connected to the gate drivers GC1, GC2, GC3, GC4, GC5, GC6, GC7, and GC8 to receive the driving power through the pad portion 12; and the second driving power transmitting line 120q overlapping the first driving power transmitting line 120p with the insulating layers 130 and 140 therebetween. The second driving power transmitting line 120q is connected to the first driving power transmitting line 120p through the contact holes 31 formed in the insulating layers 130 and 140. The contact holes 31 may be disposed to correspond to each of regions overlapping the gate drivers GC1, GC2, GC3, GC4, GC5, GC6, GC7, and GC8 along the direction that is parallel to the direction in which the gate lines G1, . . . , and Gn extend. The driving power applied to the gate drivers GC1, GC2, GC3, GC4, GC5, GC6, GC7, and GC8 is transmitted through not only the first driving power transmitting line 120p but also the second driving power transmitting line 120q.

As such, the resistance of the driving power transmitting line 120 may be effectively reduced by including the first driving power transmitting line 120p that is directly connected to the gate drivers GC1, GC2, GC3, GC4, GC5, GC6, GC7, and GC8 to receive the driving power through the pad portion 12 and the second driving power transmitting line 120q that is connected to the first driving power transmitting line 120p, thereby reducing the voltage drop of the driving power through the driving power transmitting line 120. In addition, since the driving power is simultaneously transmitted through the second driving power transmitting line 120q together with the first driving power transmitting line 120p, even when the driving power applied to the gate drivers GC1, GC2, GC3, GC4, GC5, GC6, GC7, and GC8 through the first driving power transmitting line 120p is subjected to a voltage drop due to the resistance of the respective gate drivers GC1, GC2, GC3, GC4, GC5, GC6, GC7, and GC8, the voltage drop may be compensated by the driving power transmitted through the second driving power transmitting line 120q, thereby preventing or reducing the voltage drop of the driving power due to the resistance of the gate drivers GC1, GC2, GC3, GC4, GC5, GC6, GC7, and GC8.

As described above, the gate drivers GC may be disposed at opposite sides along the first direction D1 with the gate lines G1, . . . , and Gn disposed therebetween, and the driving power transmitting line 120 including the first driving power transmitting line 120p, the second driving power transmitting line 120q, and the pad portion 12 may also be disposed at the opposite sides along the first direction D1 with the gate lines G1, . . . , and Gn disposed therebetween to be respectively connected to the gate drivers GC disposed at the opposite sides.

Figure 5:
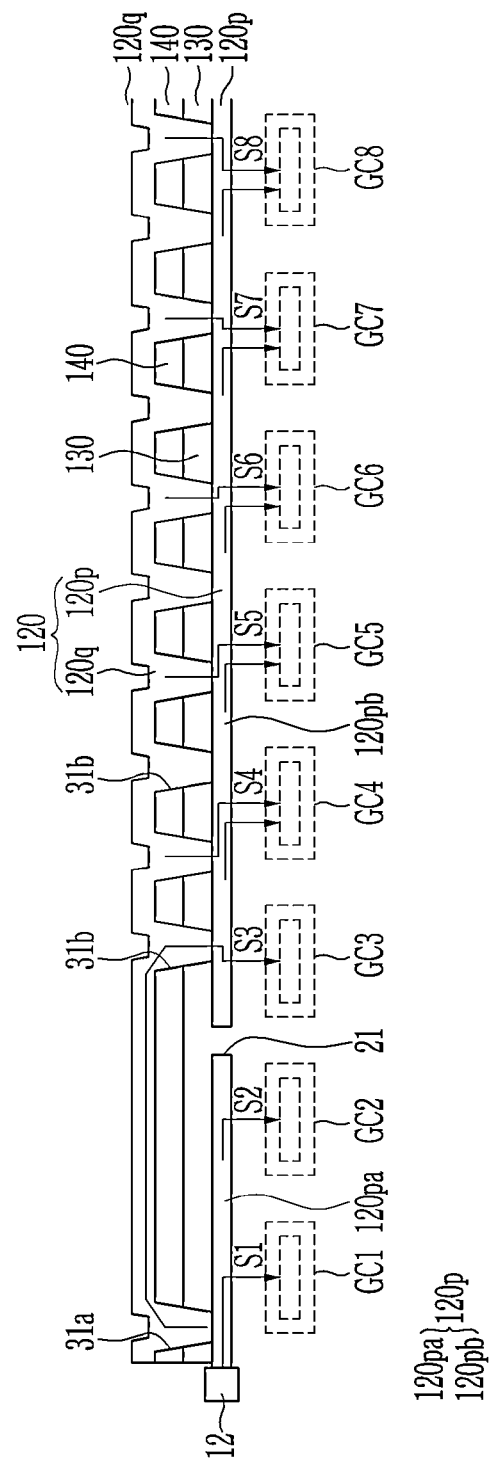
FIG. 5 illustrates a cross-sectional view of a display device according to another embodiment.

Hereinafter, a display device according to another embodiment will be described with reference to FIG. 5. FIG. 5 illustrates a cross-sectional view of a display device according to another embodiment. The driving power transmitting line 120 is disposed in the non-display area PA of FIG. 1 taken along a direction that is parallel to the second direction D2.

Referring to FIG. 5, the driving power transmitting line 120 according to the present embodiment is similar to the driving power transmitting line 120 according to the embodiment described with reference to FIG. 2 to FIG. 4.

The driving power transmitting line 120 includes a pad portion 12 that is disposed at an end portion thereof, and may supply a driving power received from the outside through the pad portion 12. The driving power transmitting line 120 includes a first driving power transmitting line 120p disposed under the insulating layers 130 and 140 and a second driving power transmitting line 120q disposed on the insulating layers 130 and 140 with the insulating layers 130 and 140 disposed therebetween. The first driving power transmitting line 120p of the driving power transmitting line 120 may be formed in the same layer as the gate lines G1, . . . , and Gn, and the second driving power transmitting line 120q of the driving power transmitting line 120 may be formed in the same layer as the data lines D1, . . . , and Dm.

Unlike the driving power transmitting line 120 described with reference to FIG. 2 to FIG. 4, the first driving power transmitting line 120p of the driving power transmitting line 120 according to the present embodiment may be divided into a first portion 120pa and a second portion 120pb that are separated by a cutout 21. The cutout 21 of the first driving power transmitting line 120p is disposed closer to the pad portion 12 with respect to a center of the first driving power transmitting line 120p. Accordingly, a length of the first portion 120pa of the first driving power transmitting line 120p that is measured along the second direction D2 in which the first driving power transmitting line 120p extends may be shorter than a length of the second portion 120pb of the first driving power transmitting line 120p that is measured along the second direction D2.

In the present embodiment, the cutout 21 of the first driving power transmitting line 120p is disposed between the second gate driver GC2 and the third gate driver GC3 among the gate drivers GC1, GC2, GC3, GC4, GC5, GC6, GC7, and GC8. However, a position of the cutout 21 of the first driving power transmitting line 120p is not limited thereto, and it may be disposed at a different portion that is relatively closer to the pad portion 12 with respect to the center of the first driving power transmitting line 120p, for example, between the first gate driver GC1 and the second gate driver GC2 or between the third gate driver GC3 and the fourth gate driver GC4.

The gate drivers GC1, GC2, GC3, GC4, GC5, GC6, GC7, and GC8 that receive the driving power may be sequentially driven in an order from the eighth gate driver GC8 that is farthest from the pad portion 12 to the first gate driver GC1 that is closest to the pad portion 12.

In this case, the eighth gate driver GC8 that is farthest from the pad portion 12 may be first driven. The seventh gate driver GC7 is driven after the eighth gate driver GC8 is driven, and a state in which the driving power is applied to the seventh gate driver GC7 is maintained until the eighth gate driver GC8 is driven. Similarly, after the seventh gate driver GC7 is driven, the sixth gate driver GC6 is driven, subsequently, the fifth gate driver GC5, the fourth gate driver GC4, the third gate driver GC3, and the second gate driver GC2 are sequentially driven, and the first gate driver GC1 that is closest to the pad portion 12 is finally driven. Accordingly, a state in which the driving power is applied to the first gate driver GC1 and the second gate driver GC2 is maintained while the eighth gate driver GC8 to the third gate driver CG3 are driven.

In addition, as described above, since the driving power supplied to the driving power transmitting line 120 from the outside through the pad portion 12 is transmitted to the gate drivers GC1, GC2, GC3, GC4, GC5, GC6, GC7, and GC8 through the driving power transfer 120, a voltage drop may occur by the resistance of the driving power transmitting line 120 and the resistance of the gate drivers GC1 to GC8.

The driving power is continuously transmitted to the first gate driver GC1 and the second gate driver GC2 that are close to the pad portion 12 until the eighth gate driver GC8 that are farthest from the pad portion 12 is first driven and then turned off, and the seventh gate driver GC7, the sixth gate driver GC6, the fifth gate driver GC5, the fourth gate driver GC4, and the third gate driver GC3 are sequentially driven and then turned off. When a difference in the driving power applied between the first gate driver GC1 and the second gate driver GC2 occurs, the difference is also maintained until the eighth gate driver GC8 that is farthest from the pad portion 12 starts to be driven and the gate drivers up to the third gate driver GC3 are sequentially driven. As a result, a period during which s voltage drop that may occur between the first gate driver GC1 and the second gate driver GC2 that are closer to the pad portion 12 is maintained is longer than a period during which a voltage drop that may occur between the seventh gate driver GC7 and the eighth gate driver GC8 that are farther from the pad portion 12 is maintained. In this case, dark lines may be easily recognizable at a gate line extending between the first gate driver GC1 and the second gate driver GC2.

The first driving power transmitting line 120p of the driving power transmitting line 120 according to the present embodiment is divided into the first portion 120pa and the second portion 120pb that are separated by the cutout 21. The cutout 21 of the first driving power transmitting line 120p is disposed close to the pad portion 12 with respect to a center of the first driving power transmitting line 120p. In addition, no contact hole for connecting the first driving power transmitting line 120p and the second driving power transmitting line 120q is disposed at a portion corresponding to the first gate driver GC1 and the second gate driver GC2 that are connected to the first portion 120pa of the first driving power transmitting line 120p along the direction in which the gate lines G1, . . . , and Gn extend.

Therefore, a voltage drop of the driving power applied to the first gate driver GC1 and the second gate driver GC2 through the pad portion 12 and the first driving power transmitting line 120p may influence or affect only the first portion 120*pa* of the first driving power transmitting line 120*p* due to the cutoff 21 of the first driving power transmitting line 120*p*, and the influence of the voltage drop of the driving power applied to the first gate driver GC1 and the second gate driver GC2 may be blocked on the second portion 120*pb* of the first driving power transmitting line 120*p*.

The second portion 120*pb* of the first driving power transmitting line 120*p* may be connected with the second driving power transmitting line 120*p* through one or more contact holes formed in the insulating layers 130 and 140 to receive the driving power.

Referring to FIG. 5, a first driving power S1 is applied to the first gate driver GC1 through the first driving power transmitting line 120*p*, and a second driving power S2 is applied to the second gate driver GC2 through the first driving power transmitting line 120*p* as well.

As described above, no contact hole for connecting the first driving power transmitting line 120*p* and the second driving power transmitting line 120*q* is disposed at a portion corresponding to the first gate driver GC1 and the second gate driver GC2 along the direction in which the gate lines G1, . . . , and Gn extend, and thus the driving power is applied to the first gate driver GC1 and the second gate driver GC2 through the first driving power transmitting line 120*p*, not through the second driving power transmitting line 120*q*.

Accordingly, the driving power applied to the second driving power transmitting line 120*q* may not be affected by a voltage drop of the driving power applied to the first gate driver GC1 and the second gate driver GC2.

A third driving power S3 is applied to the third gate driver GC3 via the second driving power transmitting line 120*q* that is connected to the first driving power transmitting line 120*p* through a first contact hole 31*a* that is disposed adjacent to the pad portion 12 and a second contact hole 31*b* that is disposed at a position corresponding to the third gate driver GC3. Similarly, a fourth driving power S4 to an eighth driving power S8 are applied to the fourth gate driver GC4 to the eighth gate driver GC8 through the first driving power transmitting line 120*p* and the second driving power transmitting line 120*q* that are connected to each other through the second contact holes 31*b*.

As described above, in accordance with the display device according to the present embodiment, the first driving power transmitting line 120*p* is divided into the first portion 120*pa* and the second portion 120*pb* that are separated by the cutout 21 of the first driving power transmitting line 120*p*. In a portion that is adjacent to the pad portion 12, the first portion 120*pa* of the first driving power transmitting line 120*p* is connected to the second driving power transmitting line 120*q*, and no contact hole for connecting the first driving power transmitting line 120*p* and the second driving power transmitting line 120*q* is disposed at a portion corresponding to the first gate driver GC1 and the second gate driver GC2 along the direction in which the gate lines G1, . . . , and Gn extend.

In addition, the second driving power transmitting line 120*q* is connected to the second portion 120*pb* of the first driving power transmitting line 120*p* through a plurality of second contact holes 31*b*. The second contact holes 31*b* are disposed to overlap the third to eighth gate drivers GC3, GC4, GC5, GC6, GC7, and GC8 along a direction that is parallel to the direction in which the gate lines G1, . . . , and Gn extend.

Accordingly, it is possible to reduce or eliminate an influence of a voltage drop of the driving power between the first gate driver GC1 and the second gate driver GC2 that is maintained for a longest period due to the proximity to the pad portion 12 while the driving power is applied to the gate drivers GC1, GC2, GC3, GC4, GC5, GC6, GC7, and GC8. Further, the voltage difference that may occur due to the voltage drop between the first gate driver GC1 and the second gate driver GC2 and may be maintained while the gate drivers are driven in a reverse order from the eighth gate driver GC8 to the third gate driver GC3 may be maintained only for a time period during which the first gate driver GC1 and the second gate driver GC2 are driven, thereby preventing dark lines or the like that may otherwise occur due to the longer duration of the voltage difference.

In addition, the driving power may be applied to the third gate driver GC3 to the eighth gate driver GC8 through the second driving power transmitting line 120*q* that is connected to the first driving power transmitting line 120*p* through the second contact holes 31*b* formed in the insulating layers 130 and 140, thereby preventing a voltage drop of the driving power that may be caused by the resistance of the driving power transmitting line 120.

Figure 6:
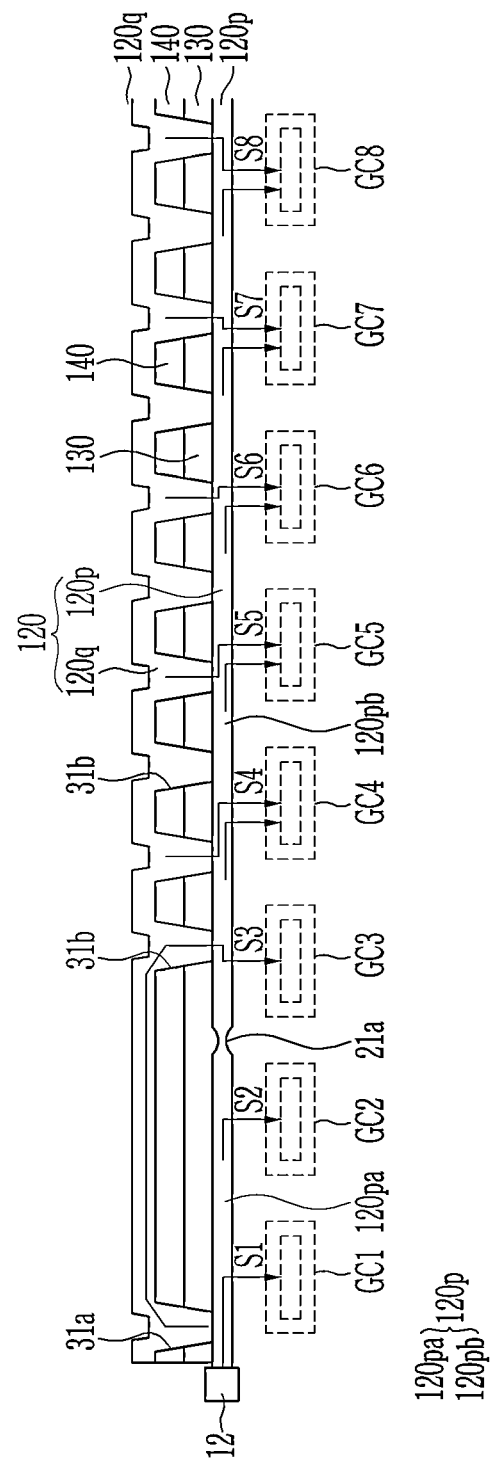
FIG. 6 illustrates a cross-sectional view of a display device according to another embodiment.

Hereinafter, a display device according to another embodiment will be described with reference to FIG. 6. FIG. 6 illustrates a cross-sectional view of a display device according to another embodiment. The driving power transmitting line 120 is disposed in the non-display area PA of FIG. 1 taken along a direction that is parallel to the second direction D2.

Referring to FIG. 6, the driving power transmitting line 120 according to the present embodiment is similar to the driving power transmitting line 120 according to the embodiment described with reference to FIG. 5.

The driving power transmitting line 120 includes a pad portion 12 that is disposed at an end portion thereof, and may supply a driving power received from the outside through the pad portion 12. The driving power transmitting line 120 includes a first driving power transmitting line 120*p* disposed under the insulating layers 130 and 140 and a second driving power transmitting line 120*q* disposed on the insulating layers 130 and 140 with the insulating layers 130 and 140 disposed therebetween. The first driving power transmitting line 120*p* of the driving power transmitting line 120 may be formed in the same layer as the gate lines G1, . . . , and Gn, and the second driving power transmitting line 120*q* of the driving power transmitting line 120 may be formed in the same layer as the data lines D1, . . . , and Dm.

Unlike the driving power transmitting line 120 described with reference to FIG. 5, a high resistance portion 21*a* having a relatively narrow width may be included between the first portion 120*pa* of the first driving power transmitting line 120*p* and the second portion 120*pb* of the first driving power transmitting line 120*p* of the driving power transmitting line 120 of the display device according to the present embodiment. The high resistance portion 21*a* having a relatively narrow width may reduce an influence of the driving power applied to the first portion 120*pa* of the first driving power transmitting line 120*p* on the second portion 120*pb* of the first driving power transmitting line 120*p*. The high resistance portion 21*a* may have a width that is narrower than of other portions of the first driving power transmitting line 120*p*, for example, about ¹⁄₁₀ of the width.

Other features of the display device according to the embodiment described with reference to FIG. 5 are applicable to the display device according to the present embodiment except the high resistance portion 21*a* that is formed instead of the cutout 21 between the first portion 120*pa* of the first driving power transmitting line 120*p* and the second portion 120*pb* of the first driving power transmitting line 120*p*.

The first driving power transmitting line 120*p* of the driving power transmitting line 120 according to the present embodiment is divided into the first portion 120*pa* of the first driving power transmitting line 120*p* and the second portion 120*pb* of the first driving power transmitting line 120*p* but are connected by the high resistance portion 21*a* with a relatively narrow width, and thus an effect of a voltage difference that may be caused by a voltage drop occurring in the first portion 120*pa* of the first driving power transmitting line 120*p* is relatively small to the second portion 120*pb* of the first driving power transmitting line 120*p*. Accordingly, it is possible to relatively reduce an influence of the voltage difference that may occur due to a voltage drop between the first gate driver GC1 and the second gate driver GC2 that is maintained for a longest period due to the proximity to the pad portion 12 while the driving power is applied to the gate drivers GC1, GC2, GC3, GC4, GC5, GC6, GC7, and GC8. Further, the voltage difference that may occur due to the voltage drop between the first gate driver GC1 and the second gate driver GC2 and may be maintained while the gate drivers are driven in a reverse order from the eighth gate driver GC8 to the third gate driver GC3 may be maintained only for a time period during which the first gate driver GC1 and the second gate driver GC2 are driven, thereby preventing dark lines or the like that may otherwise occur due to the longer duration of the voltage drop.

The first portion 120*pa* of the first driving power transmitting line 120*p* is connected to the second driving power transmitting line 120*q* through the first contact hole 31*a* that is disposed adjacent to the pad portion 12, and no contact hole for connecting the first driving power transmitting line 120*p* and the second driving power transmitting line 120*q* is disposed at a portion corresponding to the first gate driver GC1 and the second gate driver GC2 that are connected to the first portion 120*pa* of the first driving power transmitting line 120*p* along the direction in which the gate lines G1, . . . , and Gn extend.

In addition, the driving power may be applied to the third gate driver GC3 to the eighth gate driver GC8 through the second driving power transmitting line 120*q* that is connected to the first driving power transmitting line 120*p* through the second contact holes 31*b* formed in the insulating layers 130 and 140, thereby preventing a voltage drop of the driving power that may be caused by the resistance of the driving power transmitting line 120.

In addition, the driving power may be applied to the third gate driver GC3 to the eighth gate driver GC8 through the second driving power transmitting line 120*q* that is connected to the first driving power transmitting line 120*p* through the second contact holes 31*b* in the insulating layers 130 and 140, thereby preventing a voltage drop of the driving power that may be caused by the resistance of the driving power transmitting line 120.

Figure 7:
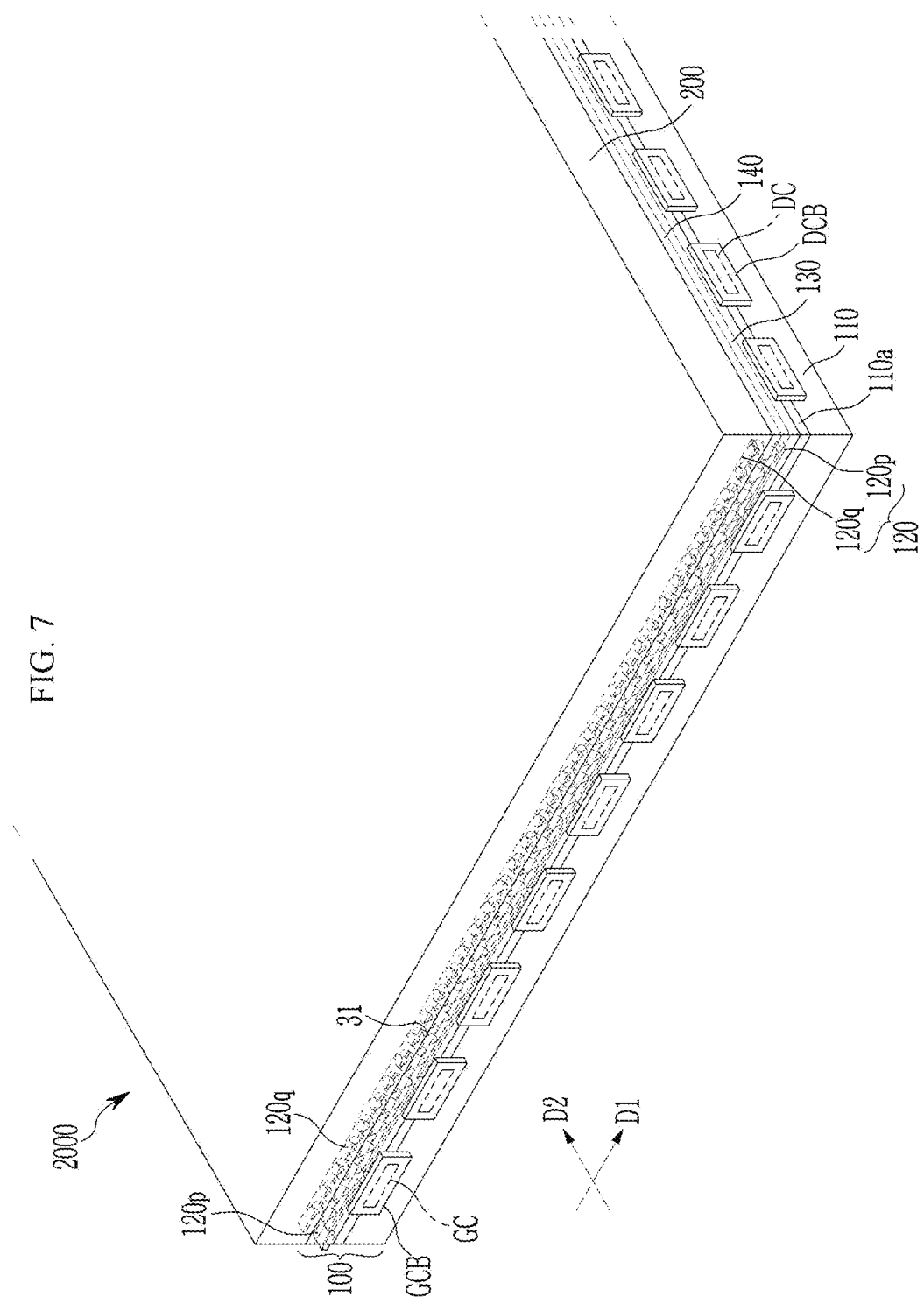
FIG. 7 illustrates a schematic perspective view of a display device according to an embodiment.

Hereinafter, a display device according to an embodiment will be described with reference to FIG. 7. FIG. 7 illustrates a schematic perspective view of a display device according to an embodiment, Referring to FIG. 7, a display device 2000 according to the present embodiment is similar to the display device according to the embodiment described with reference to FIG. 2 to FIG. 4. A detailed description of the same constituent elements will be omitted.

The driving power transmitting line 120 may have the pad portion 12 that is disposed at an end portion thereof and may supply a driving power received from the outside through the pad portion 12. The driving power transmitting line 120 includes the first driving power transmitting line 120*p* disposed under the insulating layers 130 and 140 and the second driving power transmitting line 120*q* disposed on the insulating layers 130 and 140 with the insulating layers 130 and 140 disposed therebetween. The first driving power transmitting line 120*p* and the second driving power transmitting line 120*q* are connected to each other through the contact holes 31 formed in the insulating layers 130 and 140.

In the display device 2000 according to the present embodiment, the driving power transmitting line 120 may include the first driving power transmitting line 120*p* that is directly connected to the gate drivers GC1, GC2, GC3, GC4, GC5, GC6, GC7, and GC8 to receive the driving power through the pad portion 12; and the second driving power transmitting line 120*q* overlapping the first driving power transmitting line 120*p* with the insulating layers 130 and 140 disposed therebetween and connected to the first driving power transmitting line 120*p* through the contact holes 31 formed in the insulating layers 130 and 140.

The display device 2000 includes a display panel, and the display panel includes a first display panel 100 and a second display panel 200 that are coupled to each other. Unlike the embodiment described with reference to FIG. 2 to FIG. 4 above, the gate drivers GC1, GC2, GC3, GC4, GC5, GC6, GC7, and GC8 of the display device 2000 are attached to a side surface of the display panel. The driving power transmitting line 120 may be disposed in the first display panel 100. A plurality of data drivers DC may also be attached to another side surface of the display panel. Specifically, each of the gate drivers GC1, GC2, GC3, GC4, GC5, GC6, GC7, and GC8 may be attached to a plurality of gate driving circuit boards GCB, and each of the data drivers DC may be attached to a plurality of data driving circuit boards DCB in a form of at least one integrated circuit chip. The gate driving circuit boards GCB and the data driving circuit boards DCB may be attached to a respective side surface of the display panel.

According to the present embodiment, the driving power transmitting line 120 includes the first driving power transmitting line 120*p* that is directly connected to the gate drivers GC1, GC2, GC3, GC4, GC5, GC6, GC7, and GC8 and receives the driving power through the pad portion 12 and the second driving power transmitting line 120*q* that is connected to the first driving power transmitting line 120*p* to reduce the resistance of the driving power transmitting line 120, thereby reducing a voltage drop of the driving power. In addition, since the driving power is simultaneously transmitted through the second driving power transmitting line 120*q* together with the first driving power transmitting line 120*p*, even when the driving power applied to the gate drivers GC1, GC2, GC3, GC4, GC5, GC6, GC7, and GC8 through the first driving power transmitting line 120*p* is subjected to a voltage drop due to the resistance of the respective gate drivers GC1, GC2, GC3, GC4, GC5, GC6, GC7, and GC8, the voltage drop may be compensated by the driving power transmitted through the second driving power transmitting line 120*q*, thereby preventing or reducing the voltage drop of the driving power due to the resistance of the gate drivers GC1, GC2, GC3, GC4, GC5, GC6, GC7, and GC8.

In addition, in accordance with the display device 2000 according to the present embodiment, a width of the non-display area PA may be further narrowed by attaching the gate drivers GC1, GC2, GC3, GC4, GC5, GC6, GC7, and GC8 and the data drivers DC to a side surface of the display panel.

Figure 8:
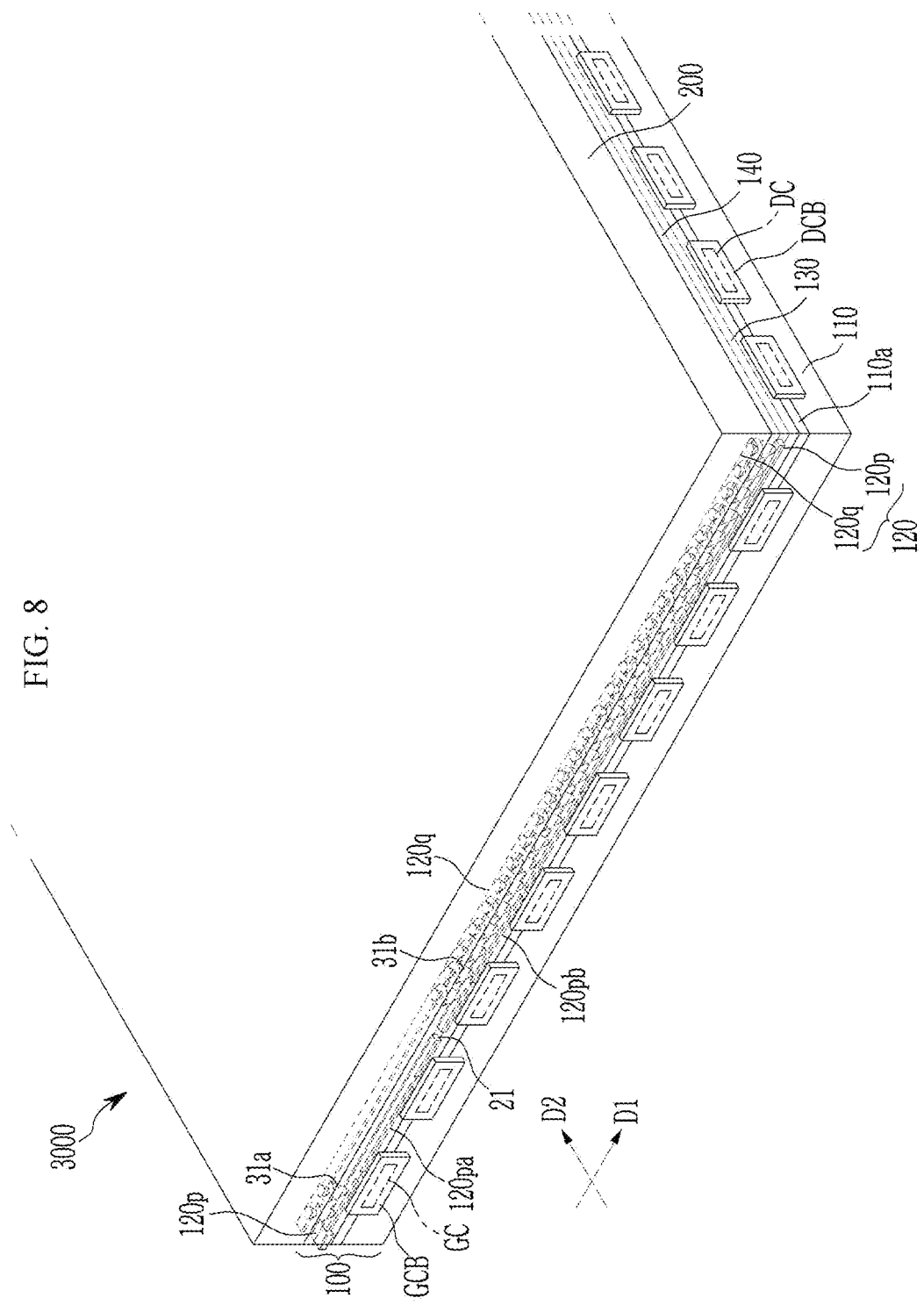
FIG. 8 illustrates a schematic perspective view of a display device according to an embodiment.

Hereinafter, a display device according to an exemplary embodiment will be described with reference to FIG. 8. FIG. 8 illustrates a schematic perspective view of a display device according to an embodiment, Referring to FIG. 8, a display device 3000 according to the present embodiment is similar to the display device according to the embodiment described with reference to FIG. 5. A detailed description of the same constituent elements will be omitted.

Similar to the driving power transmitting line 120 of the display device according to the embodiment described with reference to FIG. 5, the first driving power transmitting line 120p of the driving power transmitting line 120 of the display device 3000 is divided into the first portion 120pa and the second portion 120pb of the first driving power transmitting line 120p by the cutout 21. The cutout 21 of the first driving power transmitting line 120p is disposed closer to the pad portion 12 with respect to a center of the first driving power transmitting line 120p. Accordingly, a length of the first portion 120pa of the first driving power transmitting line 120p is shorter than that of the second portion 120pb of the first driving power transmitting line 120p.

The display device 3000 includes a display panel, and the display panel includes a first display panel 100 and a second display panel 200 that are coupled to each other. Unlike in the display device according to the embodiment described with reference to FIG. 5, the gate drivers GC1, GC2, GC3, GC4, GC5, GC6, GC7, and GC8 of the display device 3000 are attached to a side surface of the display panel. The driving power transmitting line 120 may be disposed in the first display panel 100. A plurality of data drivers DC may also be attached to another side surface of the display panel. Specifically, each of the gate drivers GC1, GC2, GC3, GC4, GC5, GC6, GC7, and GC8 may be attached to a plurality of gate driving circuit boards GCB, and each of the data drivers DC may be attached to a plurality of data driving circuit boards DCB in a form of at least one integrated circuit chip. The gate driving circuit boards GCB and the data driving circuit boards DCB may be attached to a respective side surface of the display panel.

The first portion 120pa of the first driving power transmitting line 120p is connected to the second driving power transmitting line 120q through the first contact hole 31a that is disposed adjacent to the pad portion 12, and no contact hole for connecting the first driving power transmitting line 120p and the second driving power transmitting line 120q is disposed at a portion corresponding to the first gate driver GC1 and the second gate driver GC2 along the direction in which the gate lines G1, . . . , and Gn extend. The second driving power transmitting line 120q is connected to the second portion 120pb of the first driving power transmitting line 120p through the plurality of second contact holes 31b.

As such, an influence of a voltage drop of the driving power that may occur between the first gate driver GC1 and the second gate driver GC2 may affect only the first portion 120pa of the first driving power transmitting line 120p due to the separation between the first portion 120pa and the second portion 120pb by the cutoff 21, and the influence may be blocked from propagating to the second portion 120pb of the first driving power transmitting line 120p.

The second portion 120pb of the first driving power transmitting line 120p is connected with the second driving power transmitting line 120p of the driving power transmitting line 120 through the second contact holes 31b formed in the insulating layers 130 and 140 to receive the driving power. Accordingly, the driving power applied to the second driving power transmitting line 120q may not be affected by the voltage drop that may occur between the first gate driver GC1 and the second gate driver GC2.

Accordingly, it is possible to reduce or eliminate an influence of a voltage drop of the driving power between the first gate driver GC1 and the second gate driver GC2 that is maintained for a longest period due to the proximity to the pad portion 12 while the driving power is applied to the gate drivers GC1, GC2, GC3, GC4, GC5, GC6, GC7, and GC8. Further, the influence of the voltage drop that may be caused by the first gate driver GC1 and the second gate driver GC2 and may be maintained while the gate drivers are driven in a reverse order from the eighth gate driver GC8 to the third gate driver GC3 may be maintained only for a time period during which the first gate driver GC1 and the second gate driver GC2 are driven, thereby preventing dark lines or the like that may otherwise occur due to the longer duration of the voltage drop.

The driving power may be applied to the third gate driver GC3 to the eighth gate driver GC8 through the second driving power transmitting line 120q that is connected to the first driving power transmitting line 120p through the second contact holes 31b formed in the insulating layers 130 and 140, thereby preventing a voltage drop of the driving power that may be caused by the resistance of the driving power transmitting line 120.

In addition, in accordance with the display device 3000 according to the present embodiment, a width of the non-display area PA may be further narrowed by attaching the gate drivers GC1, GC2, GC3, GC4, GC5, GC6, GC7, and GC8 and the data drivers DC to a side surface of the display panel.

Although FIG. 8 shows the embodiment in which the first driving power transmitting line 120p is divided into the first portion 120pa and the second portion 120pb by the cutout 21, the present disclosure is not limited thereto. According to one embodiment, a high resistance portion 21a with a narrow width, as shown in FIG. 6, may connect the first portion 120pa and the second portion 120pb of the first driving power transmitting line 120p to reduce or prevent an influence of a voltage difference of the driving power in the first portion 120pa of the first driving power transmitting line 120p to the second portion 120pb of the first driving power transmitting line 120p.

Figure 9:
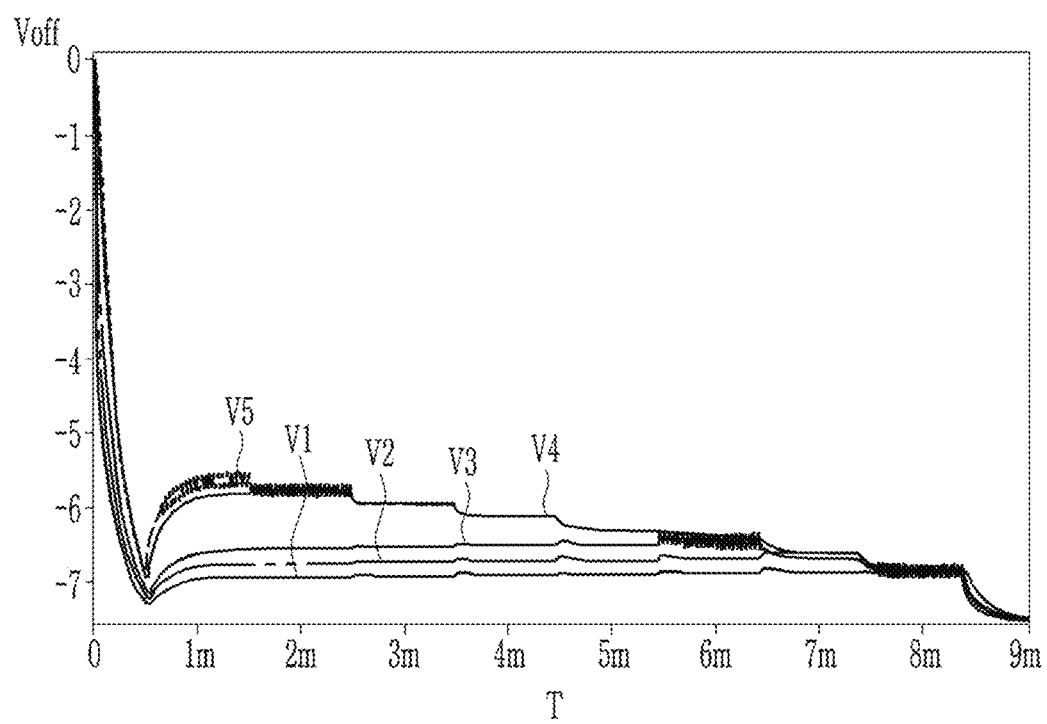
FIG. 9 illustrates a waveform diagram of a driving signal of a display device according to a comparative example.

Hereinafter, experimental examples will be described with reference to FIG. 9 to FIG. 11. FIG. 9 illustrates a waveform diagram of a driving signal of a display device according to a comparative example, FIG. 10 illustrates an image of a display device according to the comparative example of FIG. 9, and FIG. 11 illustrates a waveform diagram of a driving signal of a display device according to an embodiment.

FIG. 9 shows the comparative example of a conventional display device in which a driving power is applied to the gate drivers GC of the display device through the driving power transmitting line 120. In FIG. 9, a driving voltage V1 is measured by the first gate driver GC1 that is adjacent to the pad portion 12 of the driving power transmitting line 120, a driving voltage V2 is measured by the second gate driver GC2, a driving voltage V3 measured by the third gate driver GC3, a driving voltage V4 is measured by the seventh gate driver GC7, and a driving voltage V5 is measured by the eighth gate driver GC8 that is farthest from the pad portion 12 of the driving power transmitting line 120. FIG. 10 is an electron micrograph image of the conventional display device in an off-state. The driving voltages V1 to V5 may be gate-off voltages Voff. The x-axis of FIG. 9 is a time is a time T encompassing one image frame.

Referring to FIG. 9, a voltage difference between the driving voltage V1 of the first gate driver GC1 that is adjacent to the pad portion 12 and the driving voltage V2 of the second gate driver GC2 is greatest among the voltage differences between other driving voltages, and a time duration in which the voltage difference between the driving voltage V1 of the first gate driver GC1 and the driving voltage V2 of the second gate driver GC2 persists is almost equal to a duration of one image frame. On the other hand, a period in which a voltage difference between the driving voltage V4 of the seventh gate driver GC7 and the driving voltage V5 of the eighth gate driver GC8 that is disposed to be farthest from the pad portion 12 of the driving power transmitting line 120 appears only during the time period in which the eighth gate driver GC8 and the seventh gate driver GC7 are driven.

Figure 10:
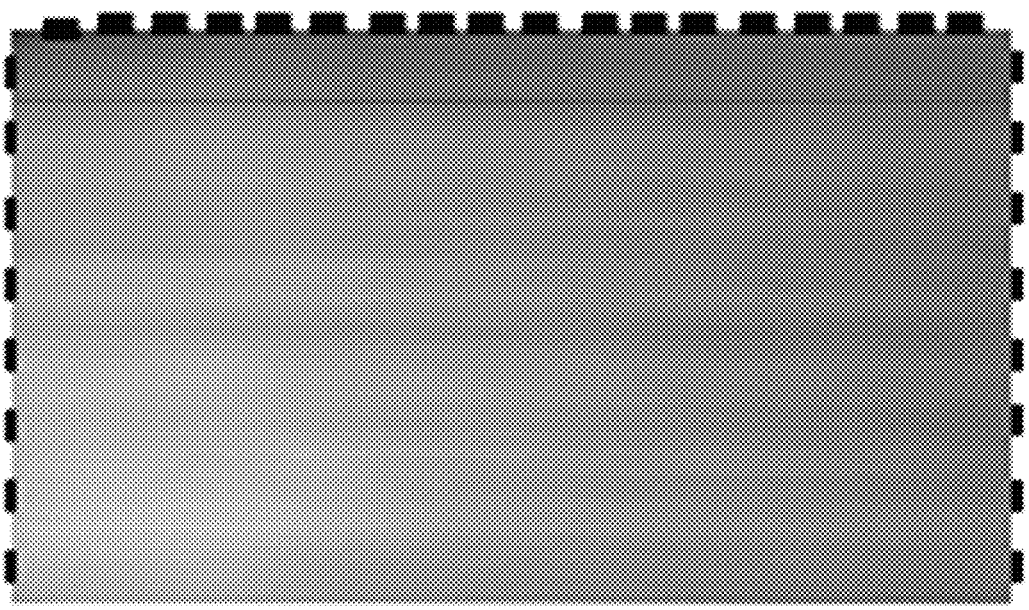
FIG. 10 illustrates an image of a display device according to the comparative example of FIG. 9.
Figure 11:
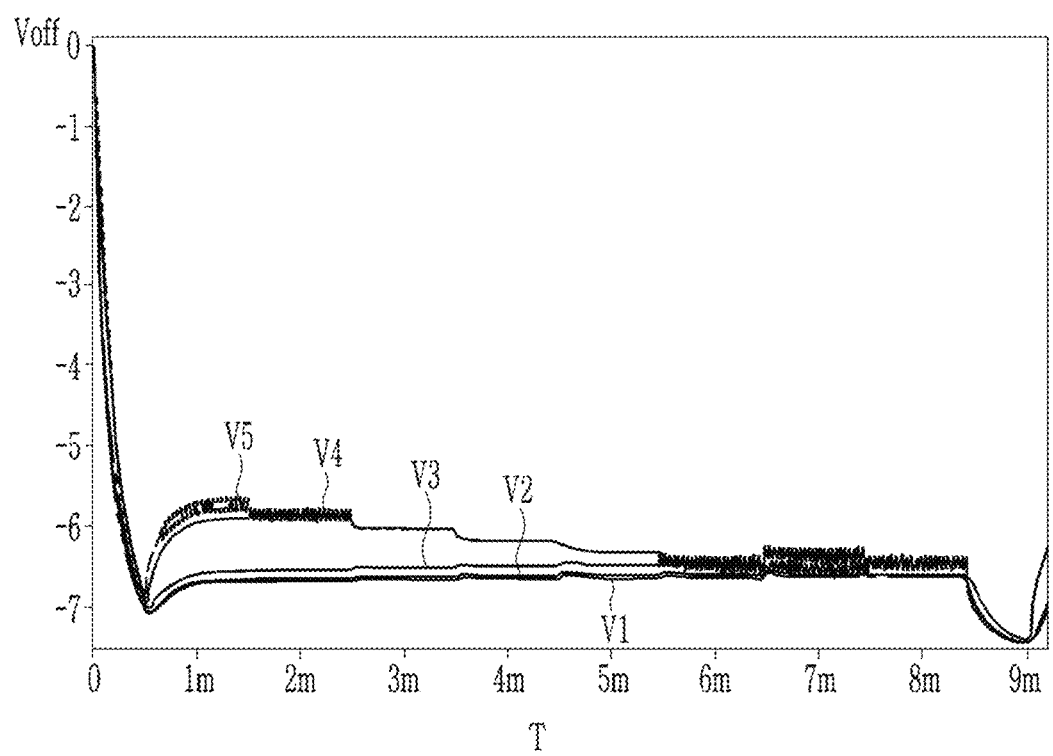
FIG. 11 illustrates a waveform diagram of a driving signal of a display device according to an embodiment.

FIG. 10 shows that the voltage difference in the driving power of each gate driver is recognizable as a dark line that is parallel with the direction in which the gate lines G1, . . . , to Gn extend based on the pad portion 12.

FIG. 10 shows an example according to an embodiment in which the driving power transmitting line 120 is formed as a double layer including the first driving power transmitting line 120*p* and the second driving power transmitting line 120*q*. The first driving power transmitting line 120*p* of the driving power transmitting line 120 may be divided into the first portion 120*pa* of the first driving power transmitting line 120*p* and the second portion 120*pb* of the first driving power transmitting line 120*p* by the cutout 21, the first portion 120*pa* of the first driving power transmitting line 120*p* may be connected to the second driving power transmitting line 120*q* only in a portion that is adjacent to the pad portion 12, and the second driving power transmitting line 120*q* may be connected to the second portion 120*pb* of the first driving power transmitting line 120*p* through the contact holes 31.

The driving power is transmitted to the gate drivers GC1 to GC8 through the driving power transmitting line 120. FIG. 11 shows the driving voltage V1 of the first gate driver GC1 that is adjacent to the pad portion 12 of the driving power transmitting line 120, the driving voltage V2 of the second gate driver GC2, the driving voltage V3 of the third gate driver GC3, the driving voltage V4 of the seventh gate driver GC7, and the driving voltage V5 of the eighth gate driver GC8 that is farthest from the pad portion 12 of the driving power transmitting line 120. The driving voltages V1 to V5 may be gate-off voltages Voff. The x-axis of FIG. 11 is a time T encompassing one image frame.

In comparison with FIG. 9, FIG. 11 that the voltage difference between the driving voltage V1 of the first gate driver GC1 that is adjacent to the pad portion 12 and the driving voltage V2 of the second gate driver GC2 is reduced, and the driving voltage V1 of the first gate driver GC1 and the driving voltage V2 of the second gate driver GC2 are maintained to be substantially the same during most the time periods within one image frame, e.g., 1 millisecond to 6.5 milliseconds. In addition, the voltage difference between the driving voltage V1 of the first gate driver GC1 and the driving voltage V2 of the second gate driver GC2 persists during a period in which the second gate driver GC2 and the first gate driver GC1 are driven.

As described above, dark lines may occur due to a long duration of the driving voltage difference. The dark lines may be reduced to be unrecognizable by shortening a time period in which the voltage difference between the driving voltage V1 of the first gate driver GC1 and the driving voltage V2 of the second gate driver GC2, which has been long in the duration.

In addition, FIG. 11 shows that the voltage difference in the driving power between two adjacent gate drivers is almost the same. In particular, absolute values of the voltage differences occurring at around 6 milliseconds, around 7 milliseconds, and around 8 milliseconds are almost the same.

As such, the display device according to the present embodiment may reduce a change difference of the driving signal applied to the gate drivers.

While the present disclosure has been described in connection with example embodiments, it is to be understood that the present disclosure is not limited to the example embodiments disclosed herein, and is intended to cover various modifications and equivalent arrangements included within the spirit and scope of present disclosure including the appended claims

DESCRIPTION OF SYMBOLS 1000, 2000, 3000: display device
120: driving power transmitting line
120*p*: first driving power transmitting line
120*q*: second driving power transmitting line
120*pa*: first portion
120*pq*: second portion
130, 140: insulating layer
21: cutout
21*a*: high resistance portion
31, 31*a*, 31*b*: contact hole
G1, Gn: gate line
D1, Dm: data line
GC, GC1, GC2, GC3, GC4, GC5, GC6, GC7, GC8: gate driver
DC, DC1, DC2, DC3, DC4, DC5, DC6, DC7, DC8: data driver
DA: display area
PA: non-display area

What is claimed is:

1. A display device comprising:
a display area including a plurality of signal lines, the plurality of signal lines including a plurality of gate lines;
a plurality of gate drivers disposed in a non-display area that is adjacent to the display area and connected to the plurality of gate lines; and
a driving power transmitting line disposed in the non-display area and providing a driving power to the plurality of gate drivers,
wherein the driving power transmitting line includes a first driving power transmitting line and a second driving power transmitting line overlapping each other with an insulating layer disposed therebetween,
wherein the first driving power transmitting line includes a first portion and a second portion that are separated from each other by a cutout,
wherein the first driving power transmitting line includes a pad portion that provides the driving power, and the first portion is connected to the pad portion,
wherein the first portion of the first driving power transmitting line is connected with the second driving power transmitting line through a first contact hole that is formed in the insulating layer, wherein the first contact hole is disposed adjacent to the pad portion without overlapping the plurality of gate drivers in a direction that is parallel to an extending direction of the plurality of gate lines, wherein the second portion of the first driving power transmitting line is connected with the second driving power transmitting line through a plurality of second contact holes formed in the insulating layer, and wherein the plurality of second contact hole is disposed to overlap the plurality of gate drivers in the direction that is parallel to the extending direction of the plurality of gate lines and overlaps the first driving power transmitting line in a plan view.

2. The display device of claim 1, wherein a first length of the first portion is shorter than a second length of the second portion.

3. The display device of claim 1, wherein the plurality of signal lines further includes a plurality of data lines, and wherein the first driving power transmitting line is disposed on a same layer as the plurality of gate lines, and the second driving power transmitting line is disposed on a same layer as the plurality of data lines.

4. The display device of claim 1, wherein the plurality of gate drivers is attached to a side surface of the display device.

5. The display device of claim 4, wherein the plurality of signal lines further includes a plurality of data lines, and wherein the first driving power transmitting line is disposed on a same layer as the plurality of gate lines, and the second driving power transmitting line is disposed on a same layer as the plurality of data lines.

* * * * *